United States Patent [19]

Plambeck

[11] Patent Number: 4,774,427

[45] Date of Patent: Sep. 27, 1988

[54] DOWNHOLE OIL WELL VIBRATING SYSTEM

[75] Inventor: Eric D. Plambeck, Carpinteria, Calif.

[73] Assignee: Piezo Sona-Tool Corporation, Carpinteria, Calif.

[21] Appl. No.: 47,268

[22] Filed: May 8, 1987

[51] Int. Cl.[4] .............................................. H01L 41/08

[52] U.S. Cl. .................................... 310/321; 310/369; 310/330

[58] Field of Search ................................ 310/330-332, 310/367, 369, 334, 336, 337, 321-323

[56] References Cited

U.S. PATENT DOCUMENTS

| | | | |
|---|---|---|---|
| 2,812,452 | 11/1957 | Harris | 310/369 X |
| 2,900,536 | 8/1959 | Palo | 310/330 |
| 3,218,636 | 11/1965 | Bernstein et al. | 310/369 X |
| 3,949,247 | 4/1976 | Fenner et al. | 310/332 |
| 4,220,887 | 9/1980 | Kompanek | 310/369 X |
| 4,651,044 | 3/1987 | Kompanek | 310/369 X |
| 4,682,070 | 7/1987 | Plumbeck | 310/337 X |

*Primary Examiner*—Mark O. Budd
*Attorney, Agent, or Firm*—Ellsworth R. Roston; Charles H. Schwartz

[57] ABSTRACT

A transducer assembly includes a piezoelectric transducer and a support member encasing the transducer. The transducer and the support member may have commonly disposed openings. The support member has a progressively increasing thickness at progressive positions from the opening to distribute equally the stresses at the different positions on the piezoelectric transducer. A plurality of such transducer assemblies may be disposed at spaced positions in an oil well with the support members supported on a support rail extending through the well. The support rail serves as an electrical ground. A bus bar extends through the well at positions corresponding substantially to the centers of the transducer assemblies. The bus bar is supported by electrically insulating spacer members extending from the support rail. A ring is supported at one end by the support rail and is coupled at the other end to a tubing. The tubing envelopes, the transducer assemblies, the support rail, the bus bar and the spacer members. An assembly including a housing, a piston and a spring respond to changes in the temperature and pressure of the fluid in the oil well to prevent the fluid from cavitating with increases in temperature or pressure.

11 Claims, 3 Drawing Sheets

FIG. 1
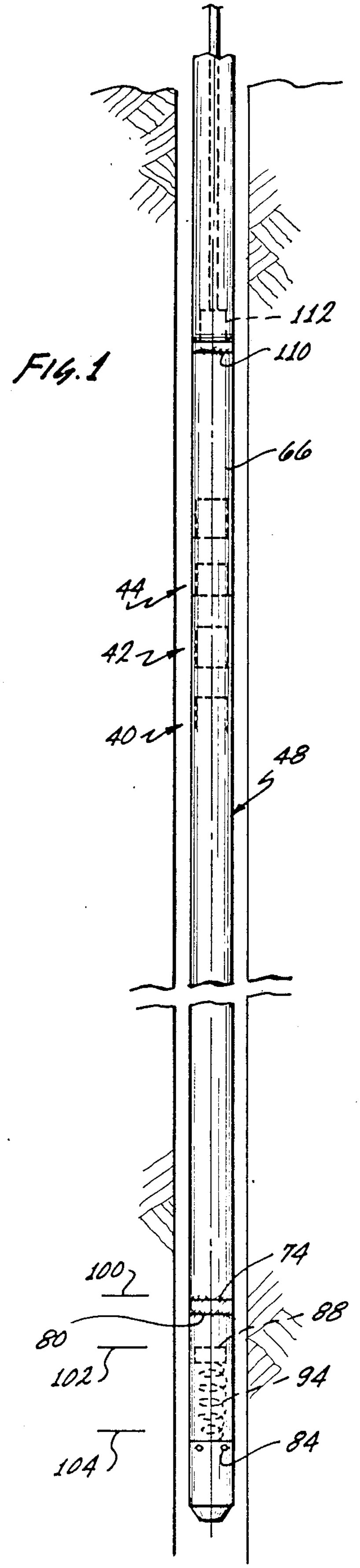
FIG. 2
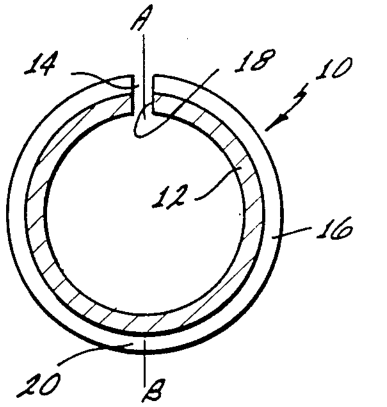
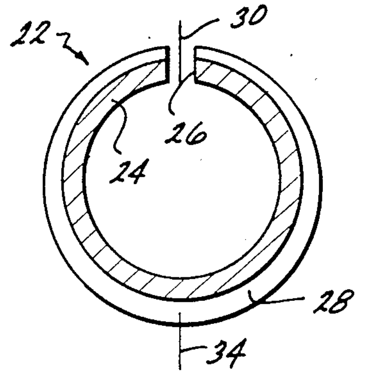
FIG. 3

DOWNHOLE OIL WELL VIBRATING SYSTEM

This is a division of application Ser. No. 635,669 filed July 30, 1984 U.S. Pat. No. 4,682,070.

This invention relates to transducer assemblies for oil wells. More particularly, the invention relates to transducer assemblies which are able to generate increased amounts of energy relative to transducer assemblies of the prior art and which are able to withstand the magnified forces resulting from the application of such increased amounts of energy. The invention also relates to apparatus including a plurality of spaced transducer assemblies which are coupled mechanically and connected electrically, to one another in a simple and reliable relationship. The invention further relates to assemblies for inhibiting any cavitation of fluid in the oil well with changes in fluid temperature or pressure.

As present oil wells are being depleted, it has become increasingly difficult to discover new sources of oil. The oil being discovered is generally at increased depths under the ground. Furthermore, the oil is often viscous and is disposed in earth surfaces where it cannot be easily removed. For these and other reasons, it has become increasingly difficult to recover such oil. Increased amounts of power are required to accumulate the oil beneath the earth's surface and to raise the oil to the ground. However, the increased amounts of power have to be generated with reliable and trouble-free equipment. Whenever any breakdown occurs in such equipment, the operation of the oil well has to be interrupted and the damaged equipment has to be raised to the earth's surface for repair or replacement. This procedure requires considerable time and considerable expense. It also prevents oil from being pumped to the earth's surface during the time that repairs are being made.

Since the oil industry is vast and is highly profitable, a considerable effort has been made, and large sums of money have been expended, to provide apparatus which will generate large amounts of energy, reliably and without breakdown, in recovering oil from beneath the earth's surface. Although such efforts have been only partially successful, the efforts have not been as successful as would be desired or expected in view of the considerable efforts involved.

This invention provides apparatus for considerably enhancing the level of energy available, reliably and without breakdown, in recovering oil from beneath the earth's surface. The apparatus of this invention provides such enhanced energy relatively simple and with no complexity and without any breakdown, or with only minimal breakdown.

A transducer assembly includes a piezoelectric transducer and a support member encasing the transducer. The transducer and the support member may have commonly disposed openings. The support member has a progressively increasing thickness at progressive positions from the opening to distribute equally the stresses at the different positions on the piezoelectric transducer.

A plurality of such transducer assemblies may be disposed at spaced positions in an oil well with the support members supported on a support rail extending through the well. The support rail serves as an electrical ground. A bus bar extends through the well at positions corresponding substantially to the centers of the transducer assemblies. The bus bar is supported by electrically insulating spacer members extending from the support rail. A ring is supported at one end by the support rail and is coupled at the other end to a tubing. The tubing envelopes the transducer assemblies, the support rail, the bus bar and the spacer members. An assembly including a housing, a piston and a spring respond to changes in the temperature and pressure of the fluid in the oil well to prevent the fluid from cavitating with increases in temperature.

In the drawings:

FIG. 1 is a schematic elevational view of an oil well and illustrates the disposition of the apparatus of this invention in the oil well;

FIG. 2 is an enlarged sectional view of a transducer assembly of the prior art;

FIG. 3 is an enlarged sectional view of a transducer assembly of this invention;

Figure 4:
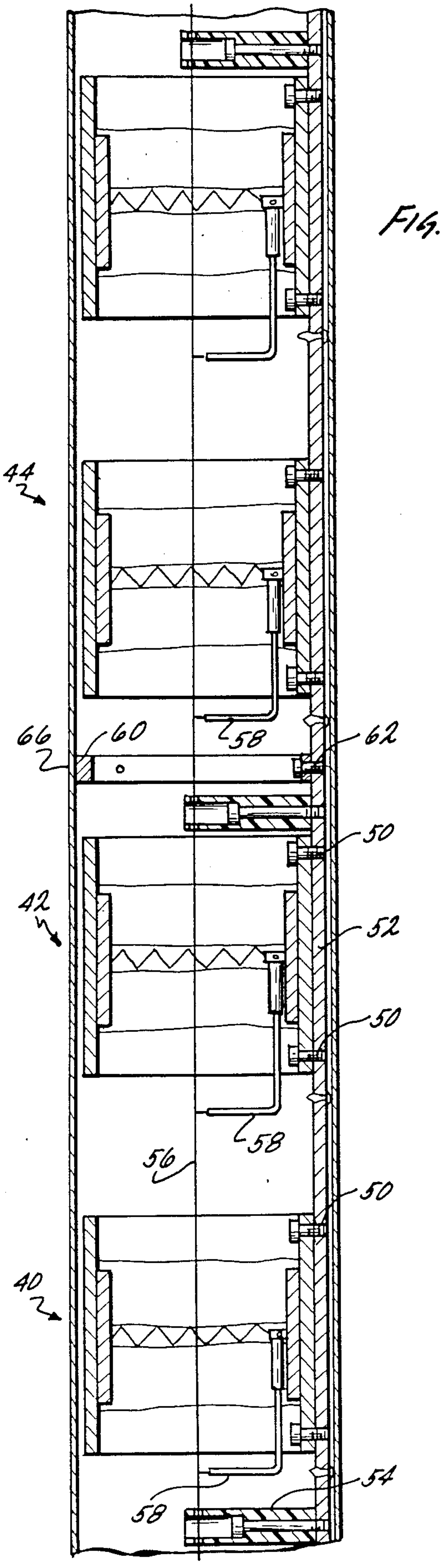
FIG. 4 is an enlarged sectional view of apparatus in the oil well for introducing electrical energy to a plurality of the transducer assemblies shown in FIG. 3 and of mechanically supporting such transducer assemblies in spaced relationship in the oil well.

FIG. 1 illustrates a transducer assembly of the prior art. This transducer assembly, generally indicated at 10, includes a transducer 12 preferably having an axial shape. An opening 14, preferably axial, is provided in the transducer 12. The transducer 12 may be made from a suitable material such as a material having piezoelectric properties. For example, the transducer 12 may be made from a ceramic such as lead zirconate titanate. A support member 16 made from a suitable material such as steel or aluminum encases the transducer 12 and is provided with an opening 18 corresponding in position to the opening 14. The support member 16 is suitably attached as by a suitable bonding agent to the transducer 12 along the common surface between the transducer and the support member.

When electrical signals are introduced to the transducer 12, the transducer vibrates. The maximum vibration occurs at the natural resonant frequency of the transducer 12. The amplitude of the vibrations decreases progressively with progressive distances from the opening 14. Thus, the minimum amplitude of vibrations occurs at a position 20 diametrically opposite the opening 14. However, the position 20 is where the maximum stress occurs in the piezoelectric transducer 12 because this is where the support member experiences the maximum amount of bending. When the vibrations become excessive, the piezoelectric transducer 12 may crack at the position 20. Thus, the ability of the transducer assembly 10 to generate energy is limited by the characteristics of the support member 16.

This invention provides a transducer assembly generally indicated at 22 in FIG. 2, with abilities to generate increased amounts of energy without cracking or becoming damaged in any way. The transducer assembly 22 includes a transducer 24 corresponding to the transducer 12. The transducer 24 has an opening 26 corresponding to the opening 14. A support member 28 made from a suitable material such as steel envelopes the transducer 24 as by an adhesive. The support member 28 is suitably attached to the transducer 24. The support member 28 is provided with an opening 30 corresponding to the opening 18 in the support member 16.

The thickness of the support member 28 is progressively increased with progressive distances from the opening 30. The thickness of the support member 28 at each position may be related to the magnitude of the stress experienced by the piezoelectric transducer 24 at that position. In this way, the maximum thickness of the support member 28 is at a position 34 diametrically opposite the opening 30. By providing progressive increases in the thickness of the support member 30 in this manner, the amplitude of the vibrations in the transducer 24 may be considerably increased without cracking or damaging the piezoelectric transducer 24.

As shown in FIGS. 1 and 3, a plurality of transducer assemblies such as those generally indicated at 40, 42, 44 and 46 are disposed in spaced relationship in a well bore 48. Each of the transducer assemblies 40, 42, 44 and 46 may be constructed in a manner corresponding to that of the transducer assembly 22. The transducer assemblies 40, 42, 44 and 46 are attached as by bolts 50 to a mounting rail 52. The mounting rail 52 serves as an electrical ground so as to ground the support members in the transducer assemblies 40, 42, 44 and 46.

A plurality of spacers 54 made from an electrically insulating material are attached to the mounting rail 52 at positions adjacent the transducer assemblies. The spacers extend to the axial center of the transducer assemblies and have holes for receiving a bus bar 56 which extends axially through the transducer assemblies 40, 42, 44 and 46. Electrical connections 58 are made from the bus bar 56 to each of the transducers 40, 42, 44 and 46. The bus bar 56 introduces voltage to the transducer assemblies 40, 42, 44 and 46 for producing vibrations in the transducer assemblies. Thus, the transducers in the assemblies 40, 42, 44 and 46 are connected electrically in parallel. This allows all of the transducers to respond to the full voltage applied to the tool shown in FIG. 3, and it forces all of the transducers to vibrate in phase with one another.

Support rings such as a ring 60 are disposed at spaced positions between the transducer assemblies 40, 42, 44 and 46 and are attached to the mounting rail 50 as by bolts 62. At their diametrically opposite end, the rings 60 are attached to a thin-walled tubing 66. Preferably the tubing 66 is provided with a thickness to provide the tubing with a resonant frequency corresponding substantially to the frequency of vibrations of the transducer assemblies 40, 42, 44 and 46. The tubing 66 is filled with a suitable fluid 68.

The apparatus described above and shown in FIG. 4 has certain important advantages. It provides for a simple and reliable support of the transducer assemblies 40, 42, 44 and 46 in the tubing 66. It also provides for a simple and convenient introduction of electrical energy to the transducers in the transducer assemblies 40, 42, 44 and 46. It also provides for a simple and convenient grounding of the support members in the transducer assemblies 40, 42, 44 and 46.

Since the fluid in the tubing 66 has mass and viscosity, it causes several effects. One effect is that an interference may be produced between adjacent transducers, particularly since they vibrate at the same frequency and phase. This results from the fact that the adjacent transducers may pump oil against one another. This may cause a loss of performance. Such interference can be minimized by separating the transducers by a sufficient distance. However, this minimizes the amount of power that can be produced by the transducers per unit of axial length in the oil well. As a result, a compromise between these parameters is effectuated.

The fluid also tends to dampen the motion of the transducer. The amount of dampening can be adjusted by choosing a fluid with the proper viscosity for a predetermined confinement of the transducers. Dampening in a vibrating system has a marked effect on the frequency response of the system. Low dampening causes a sharp and large response at resonance. High dampening produces a broadened and reduced response at and around the resonant frequencies. The amount of dampening provided depends upon the use desired for the particular tool.

Figure 5:
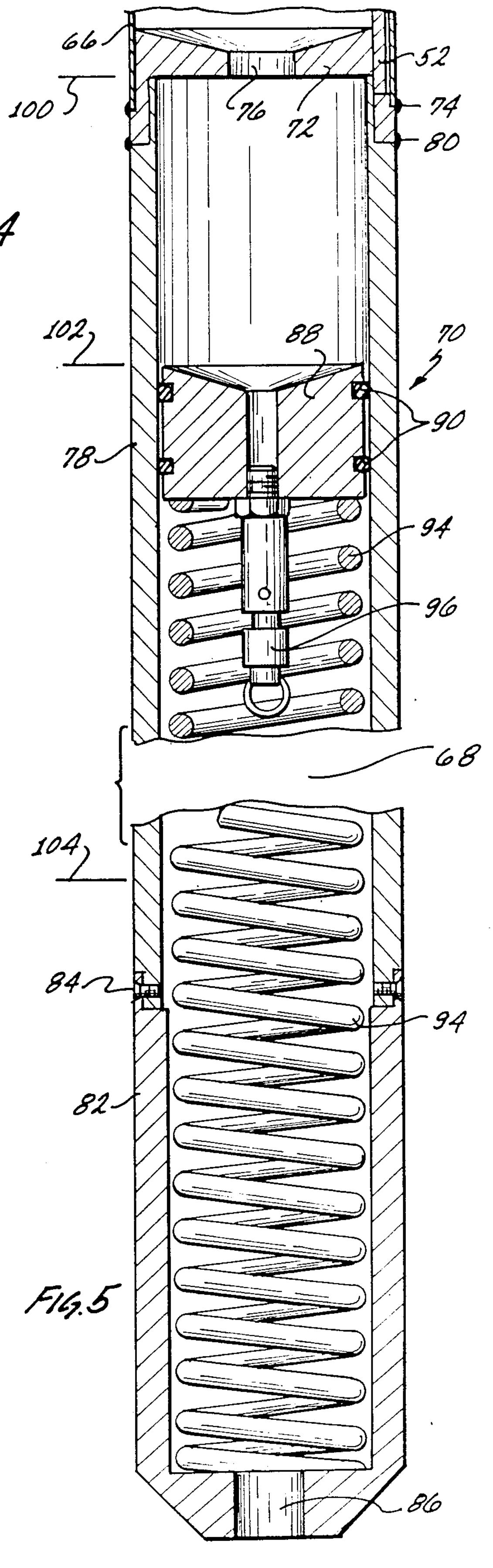
FIG. 5 is a sectional view of apparatus in the oil well for preventing the oil in the well from cavitating with changes in temperature and pressure of the fluid in the well.

FIG. 5 shows apparatus, generally indicated at 70, which is included in the oil well to prevent the fluid 68 in the tubing 66 from cavitating with changes in temperature or pressure of the fluid in the well. The apparatus 70 shown in FIG. 5 includes the mounting rail 52 and the tubing 66 also shown in FIG. 4. The apparatus 70 also includes a plug 72 attached to the tubing 66 as by a weld 74. The plug 72 is provided with a centrally disposed aperture 76.

A hollow cylinder 78 is attached to the plug 72 as by a weld 80. A hollow spring housing 82 is in turn attached to the cylinder 78 as by bolts 84. The housing 82 is provided with an aperture 86 at the end opposite the aperture 76 in the plug 72. The cylinder 78 and the housing 82 may have thicker walls than the tubing 66.

A piston 88 is disposed in the cylinder 78 for axial movement in the cylinder. O-rings 90 are disposed between the piston 88 and the cylinder 78 to seal the piston in the cylinder. A helical spring 94 is disposed in the cylinder 78 and the housing 82 in constrained relationship between the piston 88 and the end wall of the housing. A safety valve 96 may be attached to the piston 88.

As the temperature of the fluid in the oil well increases, the volume of the fluid tends to expand. This increased pressure of the fluid causes an increased force to be produced on the piston 88 so that the piston is moved to the right in FIG. 5 against the constraint provided by the spring 94. As a result of this movement, the pressure of the fluid in the transducer assembly is maintained at a particular value. This prevents any cavitation of the fluid in the transducer assembly from occurring. The movement of the piston 88 to the right in FIG. 5 may be seen from indications 100, 102 and 104 in FIG. 5. These indications show the positions of the piston 88 for respective temperatures of 30° F., 70° F. and 155° F.

The spring 94 is used to push the piston 88 to the left in FIG. 5 so as to produce a hydrostatic pressure on the transducer array shown in FIG. 4 and described above. This is desirable because the intensity of vibration of the transducers is sufficiently high to cause the fluid 68 to cavitate. Cavitation produces high stresses on the surfaces of the transducers in the transducer assemblies 40, 42, 44 and 46. These stresses can produce failures of the ceramic in the transducers. Cavitation also degrades the performance of the tool represented by the transducer assemblies 40, 42, 44 and 46.

A collateral benefit of the arrangement shown in FIG. 5 and described above is that the pressure within the tubing 66 is always greater than the pressure outside of the tubing. Therefore, regardless of the magnitude of the hydrostatic pressure in a particular tool application, the tubing 66 cannot collapse.

Figure 6:
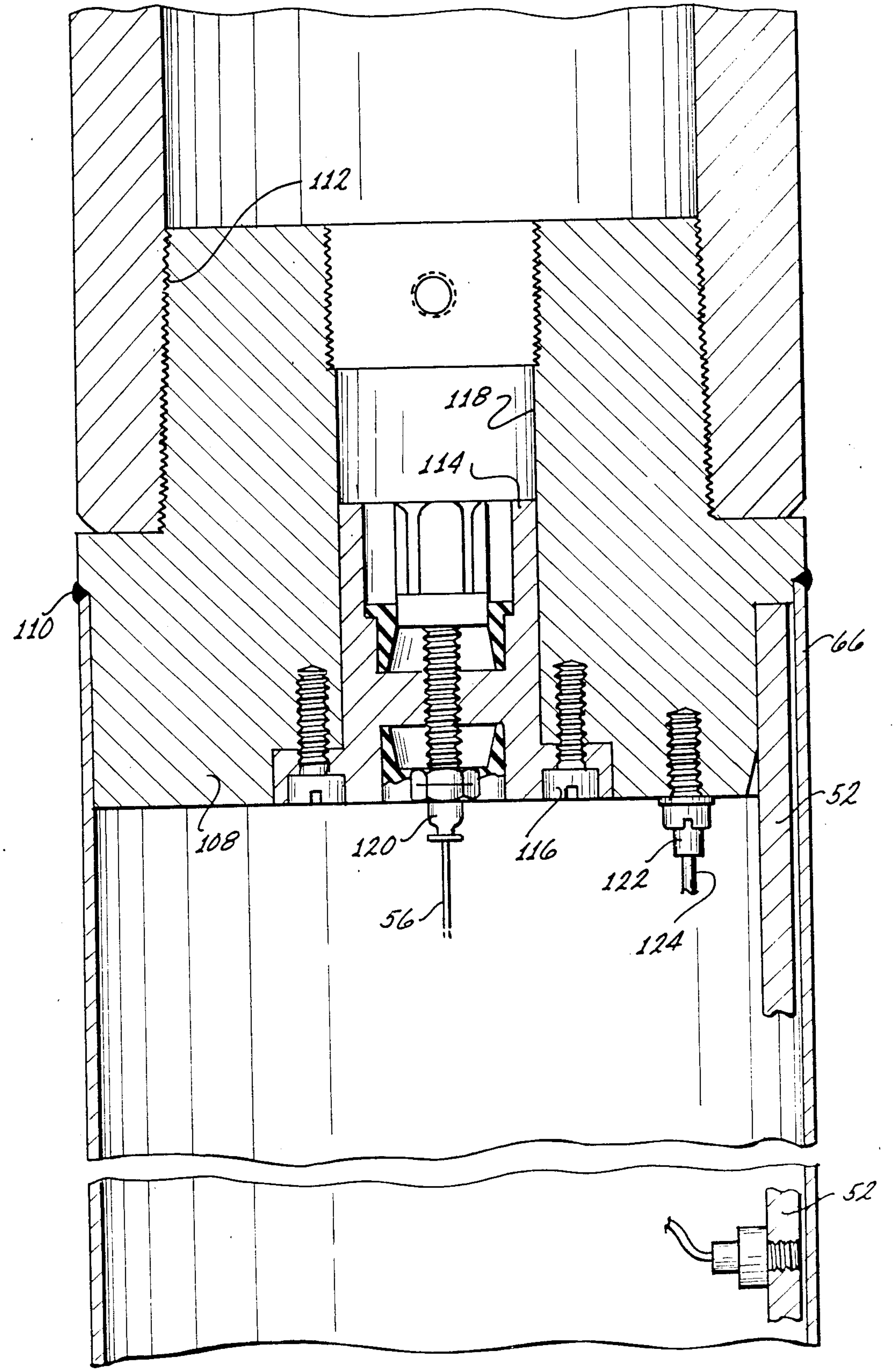
FIG. 6 is a sectional view of a connector assembly for supporting the apparatus shown in FIGS. 4 and 5 and for introducing energy to the apparatus shown in FIG. 4.

FIG. 6 illustrates a connector assembly for supporting the apparatus shown in FIGS. 4 and 5 and for introducing electrical energy to the apparatus shown in FIG. 4. The apparatus shown in FIG. 6 includes the mounting rail 52, the thin-walled tubing 66 and the bus bar 56. It also includes a plug 108 which is coupled mechanically to the tubing 66 as by a weld 110. The plug 108 is externally threaded as at 110 to attach the apparatus to a pump (not shown) which is installed at the bottom of an oil well. This is useful for long term tool installations.

The mounting rail 52 is disposed in a recess between the plug 108 and the tubing 66. A banana plug 114 made from a suitable insulating material is suitably attached as by bolts 116 to the plug 108 and is disposed in a central socket 118 in the plug 108. A terminal 120 extends from the banana plug 114 for connection to the bus bar 56. A ring terminal 122 is attached to the plug 108 to receive a ground connection 124.

The apparatus shown in FIG. 6 and described above is sufficiently strong to support the apparatus shown in FIGS. 4 and 5. It also provides a high voltage connection to the transducers in the transducer assemblies 40, 42, 44 and 46 and also establishes an electrical ground to such tool assemblies.

Although this application has been disclosed and illustrated with reference to particular applications, the principles involved are susceptible of numerous other applications which will be apparent to persons skilled in the art. The invention is, therefore, to be limited only as indicated by the scope of the appended claims.

I claim:

1. A transducer assembly, including, a piezoelectric member having a cylindrical shape and having an axially extending opening, the piezoelectric member being operative to provide a transducing action between the production of electrical signals and the production of vibrations in the piezoelectric member, and a support cylinder encasing the piezoelectric member and having an axially extending opening corresponding in position to the axially extending opening in the piezoelectric member, the support cylinder having progressive thicknesses with progressive distances from the axially extending opening.

2. A transducer assembly as set forth in claim 1 wherein the support cylinder is bonded to the piezoelectric member along the common surfaces of the support cylinder and the piezoelectric member.

3. A transducer assembly, including a transducer member having a cylindrical shape and having an axially extending opening, the transducer member being operative to provide a transducing action between the production of electrical signals and the production of vibrations in the transducer member, and a support member having an inner surface common with the outer surface of the transducer member and having an outer surface defining an eccentric.

4. A transducer assembly as set forth in claim 3 wherein the eccentric external surface of the support member defines progressively increasing thicknesses of the suport member from the position of the axially extending opening in the support member.

5. A transducer assembly as set forth in claim 4 wherein the support member is made from a metal and the support member is bonded to the transducer member along the common surfaces of the support member and the transducer member.

6. A transducer assembly as set forth in claim 1 wherein the support cylinder is made from a metal.

7. A transducer assembly as set forth in claim 1 wherein the maximum thickness of the support cylinder is at the end opposite the opening in the support cylinder.

8. A transducer assembly as set forth in claim 3 wherein the transducer member is made from a piezoelectric material and the support member is made from a metal.

9. A transducer assembly as set forth in claim 5 wherein the transducer member is made from a piezoelectric material and the maximum thickness of the support member is at the end opposite the support member.

10. A transducer assembly as set forth in claim 3 wherein the support member has an opening corresponding in position to the opening in the transducer member.

11. A transducer assembly as set forth in claim 5 wherein the support member has an opening corresponding in position to the opening in the transducer member.

* * * * *